US008627953B1

(12) United States Patent
Yeo

(10) Patent No.: US 8,627,953 B1
(45) Date of Patent: Jan. 14, 2014

(54) HOLDER FOR PORTABLE DEVICE

(75) Inventor: Young Kyu Yeo, Seoul (KR)

(73) Assignee: HSM Co., Ltd., Seoul (KR)

( * ) Notice: Subject to any disclaimer, the term of this patent is extended or adjusted under 35 U.S.C. 154(b) by 0 days.

(21) Appl. No.: 13/575,091

(22) PCT Filed: Jun. 27, 2011

(86) PCT No.: PCT/KR2011/004668
§ 371 (c)(1),
(2), (4) Date: Jul. 25, 2012

(87) PCT Pub. No.: WO2012/128424
PCT Pub. Date: Sep. 27, 2012

(30) Foreign Application Priority Data

Mar. 18, 2011 (KR) ........................ 10-2011-0024222

(51) Int. Cl.
*B65D 85/20* (2006.01)
(52) U.S. Cl.
USPC ....................................................... 206/320
(58) Field of Classification Search
USPC .............. 206/37, 38, 305, 320; 224/191, 484; 361/679.01–679.03, 679.09, 679.26, 361/679.3; 455/90.3, 575.1, 575.3, 575.4, 455/575.8
See application file for complete search history.

(56) References Cited

U.S. PATENT DOCUMENTS

| 5,299,685 | A * | 4/1994 | Chin | 206/320 |
| 5,855,278 | A * | 1/1999 | Harfst | 206/320 |
| 6,050,014 | A * | 4/2000 | Ohlson | 206/37 |
| 6,648,139 | B2 * | 11/2003 | Fisher et al. | 206/320 |
| 7,337,899 | B2 * | 3/2008 | Sterns | 206/320 |
| 7,464,813 | B2 * | 12/2008 | Carnevali | 206/320 |
| 2009/0014487 | A1 * | 1/2009 | Fan | 224/483 |
| 2011/0132950 | A1 * | 6/2011 | Culver | 224/485 |
| 2011/0278885 | A1 * | 11/2011 | Procter et al. | 224/275 |
| 2012/0037673 | A1 * | 2/2012 | Chen et al. | 224/191 |

FOREIGN PATENT DOCUMENTS

| KR | 1020040074817 | 8/2004 |
| KR | 1020070062402 | 6/2007 |
| KR | 10-0796468 | 1/2008 |

OTHER PUBLICATIONS

Korean Office action for 10-2011-002422 mailed Dec. 31, 2012, citing the above reference(s), ( 7 pages ).
Korean Office action for 10-2011-002422 mailed Jun. 19, 2012, citing the above reference(s), ( 8 pages ).

* cited by examiner

*Primary Examiner* — Luan K Bui
(74) *Attorney, Agent, or Firm* — Lowe Hauptman & Ham, LLP

(57) ABSTRACT

A holder for a portable device includes: a main body having the portable device received on a front surface portion thereof; a first switch formed at a designated position of the front surface portion of the main body so as to be push into and protruded from the front surface portion; first and second arms formed at both side surfaces of the main body, and having a distance provided therebetween and varied by the first switch such that the portable device is attached or detached; and a second switch including a first button formed to be physically connected to the first arm inside the main body and a second button formed to be physically connected to the second arm inside the main body, and varying the distance between the first and second arms.

20 Claims, 8 Drawing Sheets

HOLDER FOR PORTABLE DEVICE

CROSS REFERENCE TO RELATED APPLICATION

This application claims the priority of Korean Patent Application No. 10-2011-0024222, filed on Mar. 18, 2011 in the KIPO (Korean Intellectual Property Office). Further, this application is the National Phase application of International Application No. PCT/KR2011/004668 filed Jun. 27, 2011, which designates the United States and was filed in Korean.

BACKGROUND OF THE INVENTION

The present invention relates to a holding mechanism, and more particularly, to a holder for a portable device.

A personal portable device represented by a mobile phone has become a necessity which is owned by each person. According to one survey, the international mobile phone penetration rate in 2000 was about 12%, but the international mobile phone penetration rate in 2009 increased to about 67%. They expect that start phones which have been recently popularized will also experience the previous ten years' penetration growth rate.

Various portable devices, such as vehicle navigators, multimedia players, portable broadcasting receivers and digital cameras/camcorders, as well as the mobile phones are commonly used, and various accessory industries for portable devices are also developing together. In particular, a holder for holding a portable device is used for holding the portable device during driving or during study or business hours.

However, although mobile devices made by different makers may provide the same or similar functions, the mobile devices have different sizes from each other. Therefore, when a user replaces his/her mobile phone with a different model, the user must replace a holder which was purchased for the mobile phone. Therefore, when the usable holder is replaced, it may result in an unnecessary cost. Furthermore, when the usable holder is discarded, it is a waste of resources.

Furthermore, when a mobile device is attached to or detached from an existing holder, a user must manipulate a plurality of buttons or apply a physical force, which may make the user feel uncomfortable. When a physical force is applied, an impact may be transmitted to the mobile device.

SUMMARY OF THE INVENTION

An embodiment of the present invention is directed to a holder for mounting and detaching a portable device.

Another embodiment of the present invention is directed to a holder for stably holding a portable device using a simple structure.

According to an embodiment of the present invention, a holder for a portable device includes: a main body having the portable device received on a front surface portion thereof; a first switch formed at a designated position of the front surface portion of the main body so as to be push into and protruded from the front surface portion; first and second arms formed at both side surfaces of the main body, and having a distance provided therebetween and varied by the first switch such that the portable device is attached or detached; and a second switch including a first button formed to be physically connected to the first arm inside the main body and a second button formed to be physically connected to the second arm inside the main body, and varying the distance between the first and second arms.

DESCRIPTION OF SPECIFIC EMBODIMENTS

Figure 1:
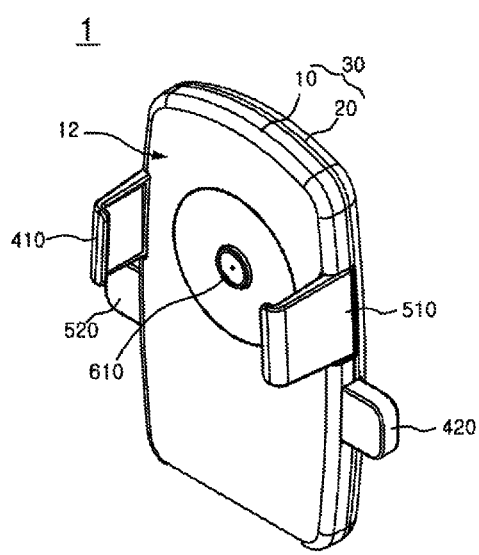
FIG. 1 is a perspective view of a holder for a portable device according to one embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a perspective view of a holder for a portable device according to one embodiment of the present invention.

Referring to FIG. 1, the holder 1 according to the embodiment of the present invention includes a main body 30 having a front surface portion 12 on which a mobile device is received. The main body 30 includes a front cover 10 and a rear cover 20, and may be formed to have substantially a rectangular cross-section when seen at the side of the front surface portion 12.

Furthermore, the main body 30 has a first switch 610 formed at a designated position of the front surface portion 12, and the first switch 610 protrudes to the outside of the front surface portion 12 from the inside of the main body 30. The first switch 610 may include a push switch, for example. The first switch 610 is pushed to the inside by a pressure which is applied when the mobile device is held on the front surface portion 12. Furthermore, an operation of pulling the first switch 610 is performed by first and second buttons 420 and 520 which will be described below. The detailed descriptions of the operation will be made below.

Meanwhile, the main body 30 has first and second arms 410 and 510 formed at both side surfaces thereof. The first and second arms 410 and 510 have a distance from each other, which is varied by a push/pull operation of the first switch 610. When the first switch 610 is pushed to the inside of the main body 30, the distance between the first and second arms 410 and 510 is decreased toward the inside the main body such that the portable device is fixed on the front surface portion 12 by the first and second arms 420 and 520. Furthermore, when the first switch 610 is pulled from the main body 30 by a pressurizing operation of the first and second buttons 420 and 520 which will be described below, the distance between the first and second arms 410 and 510 is increased, so that the user may detach the mobile device from the holder.

The first and second buttons 420 and 520 form a second switch. The first button 420 is physically connected to the first arm 410 inside the main body 30. Therefore, when the first arm 410 is moved to the inside of the main body 30, the first button 420 protrudes to the outside of the body 30. Similarly, when the second arm 510 is moved to the inside of the main body 30, the second button 520 protrudes to the outside of the main body 30.

In the holder 1 for the portable device, when the portable device is closely attached to the front surface portion 12, the first switch 610 is pushed to the inside of the main body 30. Accordingly, the distance between the first and second arms 410 and 510 is decreased to fix the portable device. At the same time, the first and second buttons 420 and 520 protrude to the outside. In this state, when the first and second buttons 420 and 520 are pressurized toward the inside of the main body 30, the distance between the first and second arms 410 and 510 is increased toward the outside of the main body 30, and the first switch 610 protrudes. Then, the user may detach the portable device from the holder 1.

Figure 2:
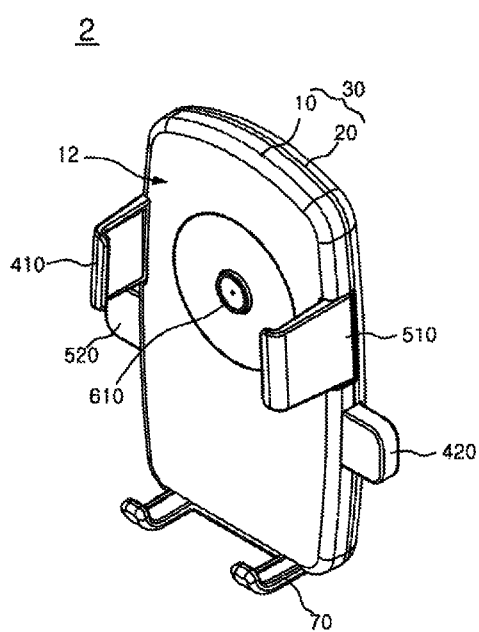
FIG. 2 is a perspective view of a holder for a portable device according to another embodiment of the present invention.

FIG. 2 is a perspective view of a holder for a portable device according to another embodiment of the present invention.

The holder 2 according to the embodiment of the present invention further includes a bracket 70 in addition to the components of the holder 1 illustrated in FIG. 1.

The bracket 70 is formed at the bottom of the main body 30 and serves to support a portable device such that the portable device does not come off from the holder 2. The bracket 70 is fixed to a rear surface portion of the main body 30 through a knob. The knob may be formed in a screw type, for example. The bracket 70 may be moved left and right and/or up and down in a state where the knob is released. Furthermore, the bracket 70 may be formed in such a shape that the central portion thereof is opened. Through the opened portion, an external connection cable of the portable device may be passed.

The structure of the holder 2 will be described in more detail with reference to FIGS. 3 to 5.

Figure 3:
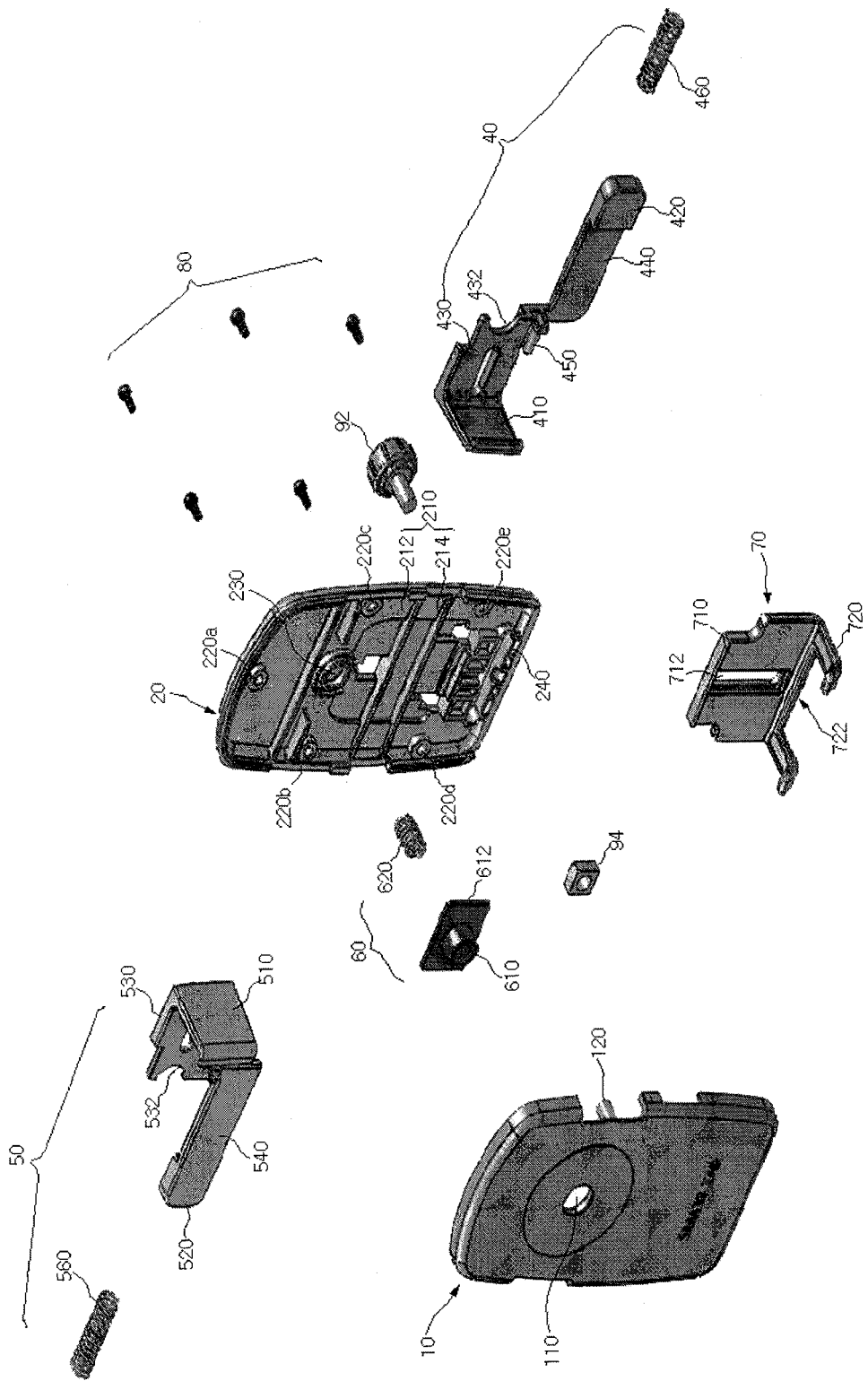
FIG. 3 is an exploded perspective view of the holder illustrated in FIG. 2.
Figure 4:
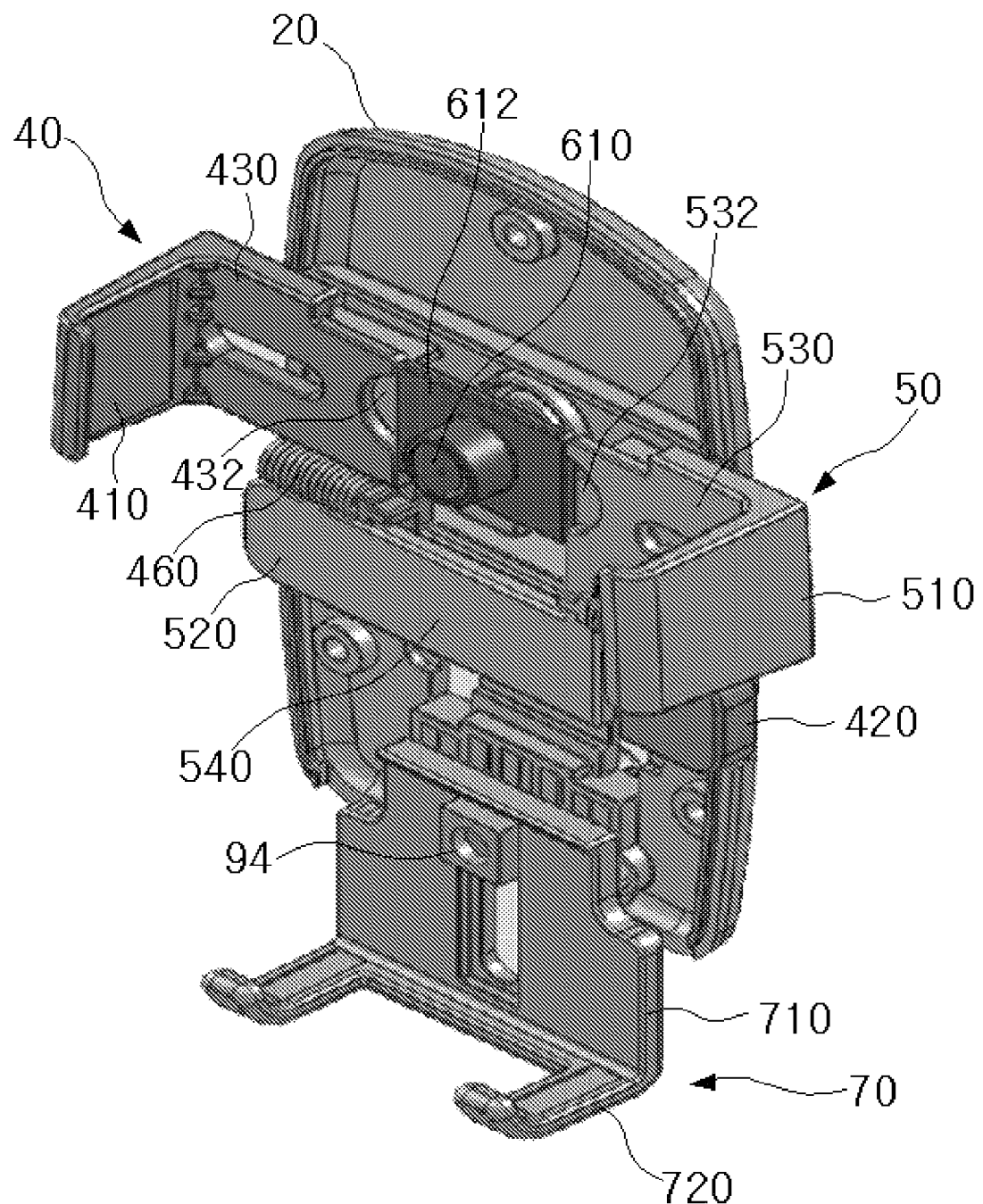
FIGS. 4 and 5 are assembled perspective views of the holder illustrated in FIG. 2.
Figure 5:
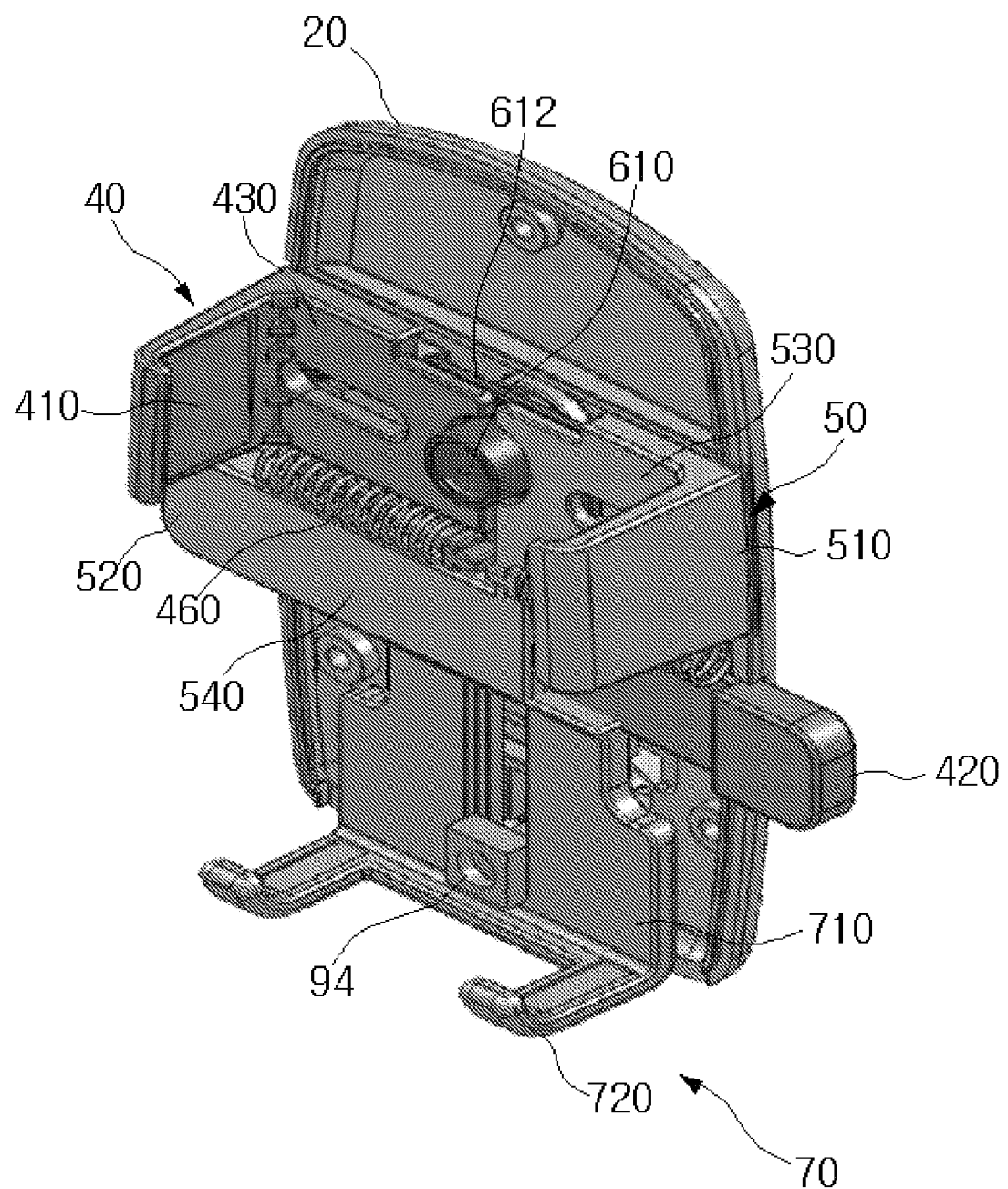

FIG. 3 is an exploded perspective view of the holder illustrated in FIG. 2, and FIGS. 4 and 5 are assembled perspective views of the holder illustrated in FIG. 2.

Referring to FIG. 3, the front cover 10 of the main body 30 includes a switch through-hole 110 through which the first switch 610 is pushed/pulled. Furthermore, the front cover 10 includes one or more coupling protrusions 120 formed at designated positions on a back surface of the front cover 10, that is, a surface contacted with the rear cover 20 such that the front and second covers 10 and 20 are coupled to each other through the coupling protrusions 120.

The rear cover 20 includes a housing unit 210 to house first and second attach/detach control units 40 and which will be described below. In particular, the housing unit 210 includes an upper housing unit 212 and a lower housing unit 214. Furthermore, the rear cover 20 includes coupling grooves 220a, 220b, 220c, 220d, and 220e formed at positions corresponding to the coupling protrusions 120 provided on the front cover 10. In a state where the front and rear covers 10 and 20 are coupled to each other after internal devices are assembled, the coupling grooves 220a, 220b, 220c, 220d, and 220e and the coupling protrusions 120 are fixed through screws 80. Furthermore, the rear cover 20 has a switch assembling hole 230 formed at a designated position thereof, or desirably, the central portion of the upper housing unit 212. Through the switch assembling hole 230, a switching unit 60 is coupled to the rear cover 20. Furthermore, the rear cover 20 has a hole 240 formed at the bottom thereof and coupled to a knob 92 for fixing or moving the bracket 70. The knob 92 forms a pair with a nut 94. Depending on the open or close state of the knob 92, the bracket 70 may be moved or fixed.

The first attach/detach control unit 40 includes a first arm 410, a first button 420, a first arm moving shaft 430, a first button moving shaft 440, and a first elastic shaft 450. The first arm 410 is pushed into and protruded from one side surface of the main body 30. The first button 420 is pushed into and protruded from the other side surface of the main body 30. The first arm moving shaft 430 provides a physical force to push/protrude the first arm 410. The first button moving shaft 440 provides a physical force to push/protrude the first button 420. The first elastic shaft 450 is coupled to a first elastic member 460.

Similarly, the second attach/detach control unit 50 includes a second arm 510, a second button 520, a second arm moving shaft 530, a second button moving shaft 540, and a second elastic shaft (not illustrated). The second arm 510 is pushed into and protruded from the other side surface of the main body 30. The second button 520 is pushed into and protruded from the one surface of the main body 30. The second arm moving shaft 530 provides a physical force to push/protrude the second arm 510. The second button moving shaft 540 provides a physical force to push/protrude the second button 520. The second elastic shaft is coupled to a second elastic member 560.

Here, the arm moving shafts 430 and 530 have one side extended perpendicular to the arms 410 and 510, and the button moving shafts 440 and 540 are extended in the same direction as the extension direction of the arm moving shafts 430 and 530 from positions spaced at a designated distance in a direction perpendicular to the extension direction of the arm moving shafts 430 and 530, respectively. One ends of the button moving shafts 440 and 540 serve as the buttons 420 and 520, respectively.

Furthermore, the elastic shafts 450 and 550 are formed to a designated length in the formation direction of the arm moving shafts 430 and 530 from the other ends of the button moving shafts 440 and 540, and coupled to the elastic members 460 and 560, respectively.

Referring to FIGS. 4 and 5, the first arm moving shaft 430 of the first attach/detach control unit 40 is housed in one side (for example, left side) of the upper housing unit 212, and the first button moving shaft 440 is housed in the other side (for example, right side) of the lower housing unit 213. Accordingly, the first arm 410 may be protruded from one side of the main body 30, and the first button 420 may be protruded from the other side of the main body 30. The second arm moving shaft 530 of the second attach/detach control unit 50 is housed in the other side of the upper housing unit 212, and the second button moving shaft 540 is housed in one side of the lower housing unit 214. Accordingly, the second arm 510 may be protruded from the other side of the main body 510, and the second button 520 may be protruded from the one side of the main body 30.

Meanwhile, the switching unit 60 includes a third elastic member 620 and the first switch 610 having a pressurization plate 612. The pressurization plate 612 serves to pressurize the third elastic member 620 through a rear surface portion thereof in a designated state. The first switch 610 is formed to protrude from a designated position on a front surface portion of the pressurization plate 612, for example, the center portion of the pressurization plate 612.

The first switch 610 including the third elastic member 620 and the pressurization plate 612 is assembled into the switch assembling hole 230. Furthermore, the first and second attach/detach control units 40 and 50 are assembled. In a state where the third elastic member 620 is not pressurized, the first switch 610 has a protruding shape, and the other sides of the first and second arm moving shafts 430 and 530 of the first and second attach/detach control units 40 and 50 are closely attached to both sides of the pressurization plate 612. At this time, the first and second elastic members 460 and 560 are compressed, the distance between the first and second arms 410 and 510 is increased toward the outside of the main body 30, and the first and second buttons 420 and 520 are pushed to the inside of the main body 30. When a physical force is applied to the first switch 610, the pressurization plate 612 compresses the third elastic member 620, and the first and second arms 410 and 510 are pushed to the inside of the main body 30 by restoring forces of the first and second elastic members 460 and 560. Meanwhile, the first and second buttons 420 and 520 are protruded to the outside of the main body 30. Furthermore, the switch coupling grooves 432 and 532 formed at the ends of the first and second arm moving shafts 430 and 530 are coupled to the first switch 610, thereby maintaining a state where the pressurization plate 612 pressurizes the third elastic member 620.

Figure 6:
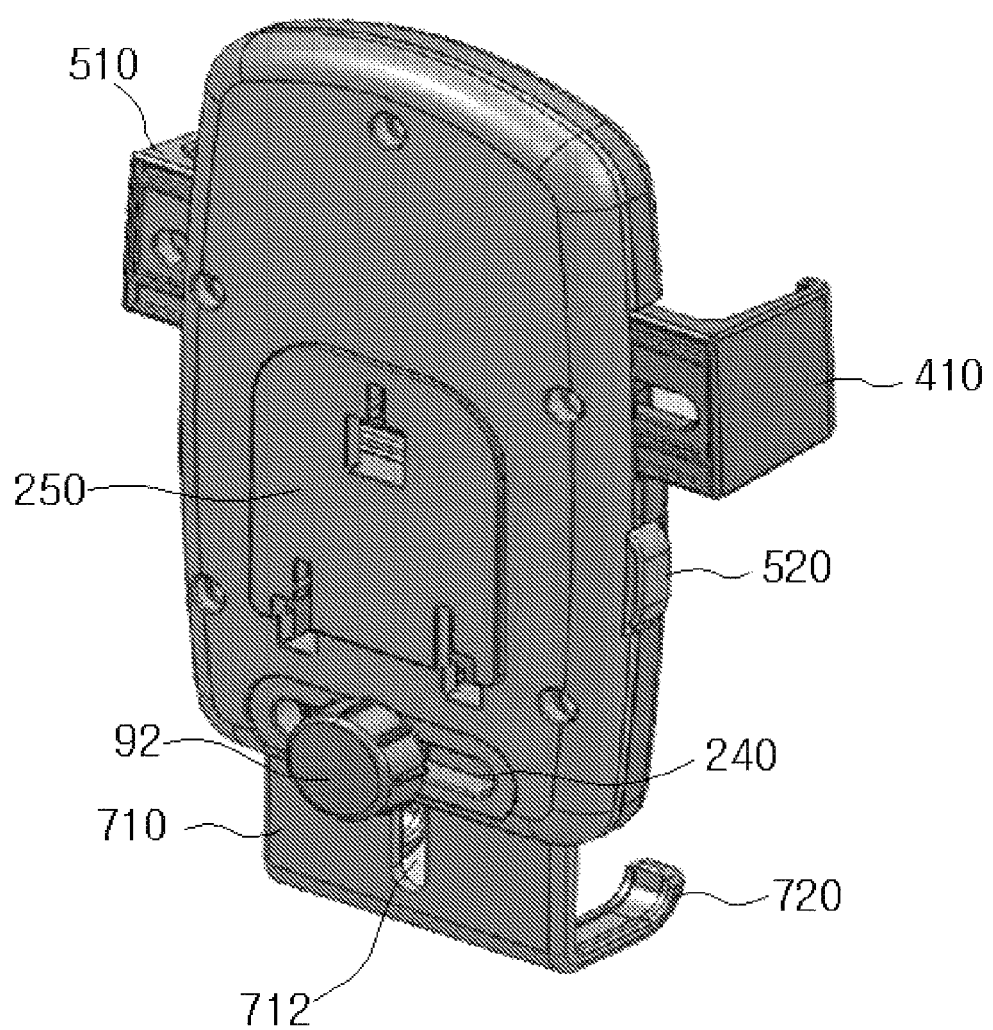
FIG. 6 is a perspective view illustrating the rear surface of the holder to which a bracket is coupled

Meanwhile, the bracket 70 is fixed to the hole 240 of the rear cover 20 through the knob 92 and the nut 94. FIG. 6 is a perspective view illustrating the rear surface of the holder to which the bracket 70 is coupled. Referring to FIG. 6, the width of the hole 240 is decided by considering the diameter of the screw portion of the knob 92, and the length of the hole 240 is set in such a designated range that the bracket 70 may move left and right.

Furthermore, the bracket 70 includes an up and down moving unit 710 and a support unit 720. The up and down moving unit 710 is pushed to and protruded from the inside of the main body 30, and the support unit 720 has an opening 722 formed in the center thereof. In order for the bracket 70 to move up and down inside the main body 30, the up and down moving unit 710 has a movement hole 712 formed by considering the diameter of the screw portion of the knob 92.

Figure 7:
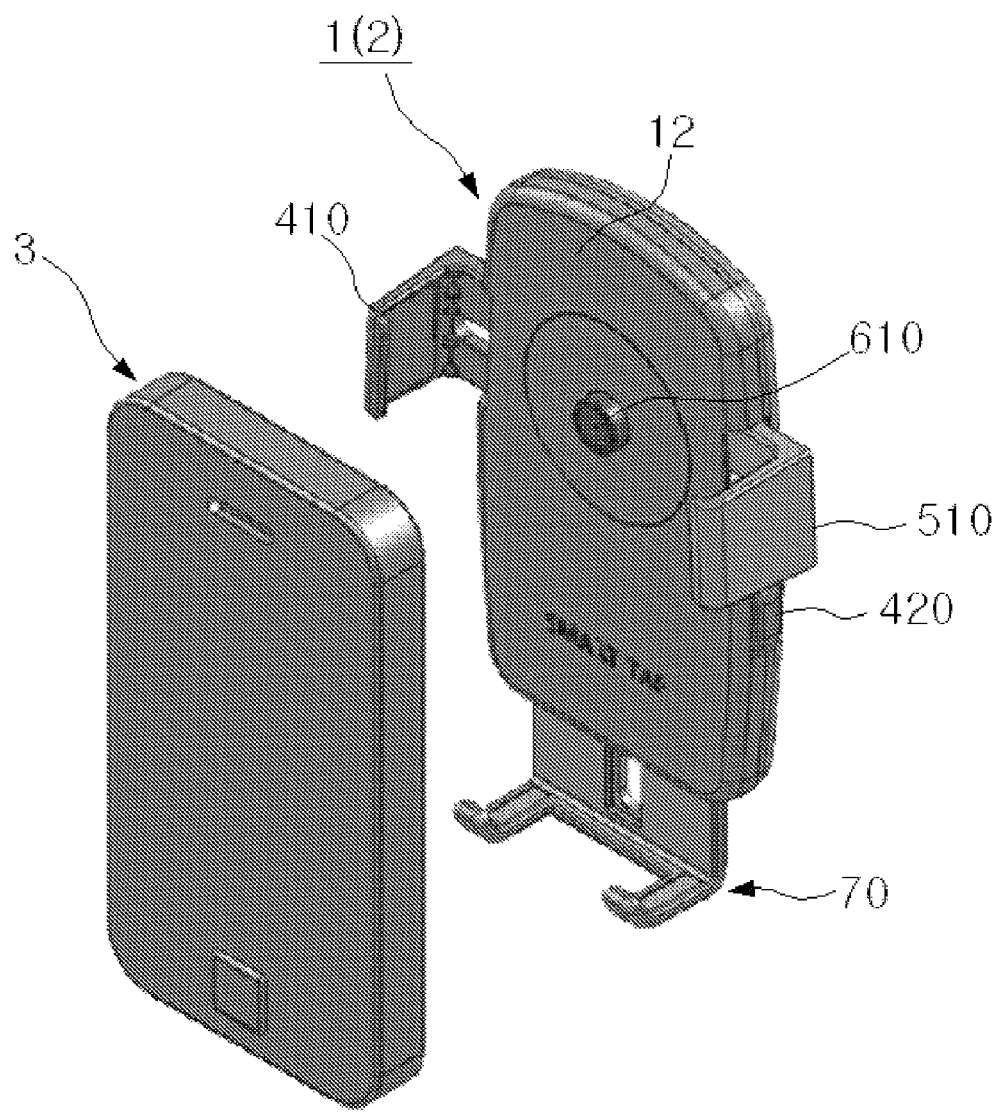
FIGS. 7 and 8 are diagrams for explaining a method for holding a mobile device using the holder according to the embodiment of the present invention.
Figure 8:
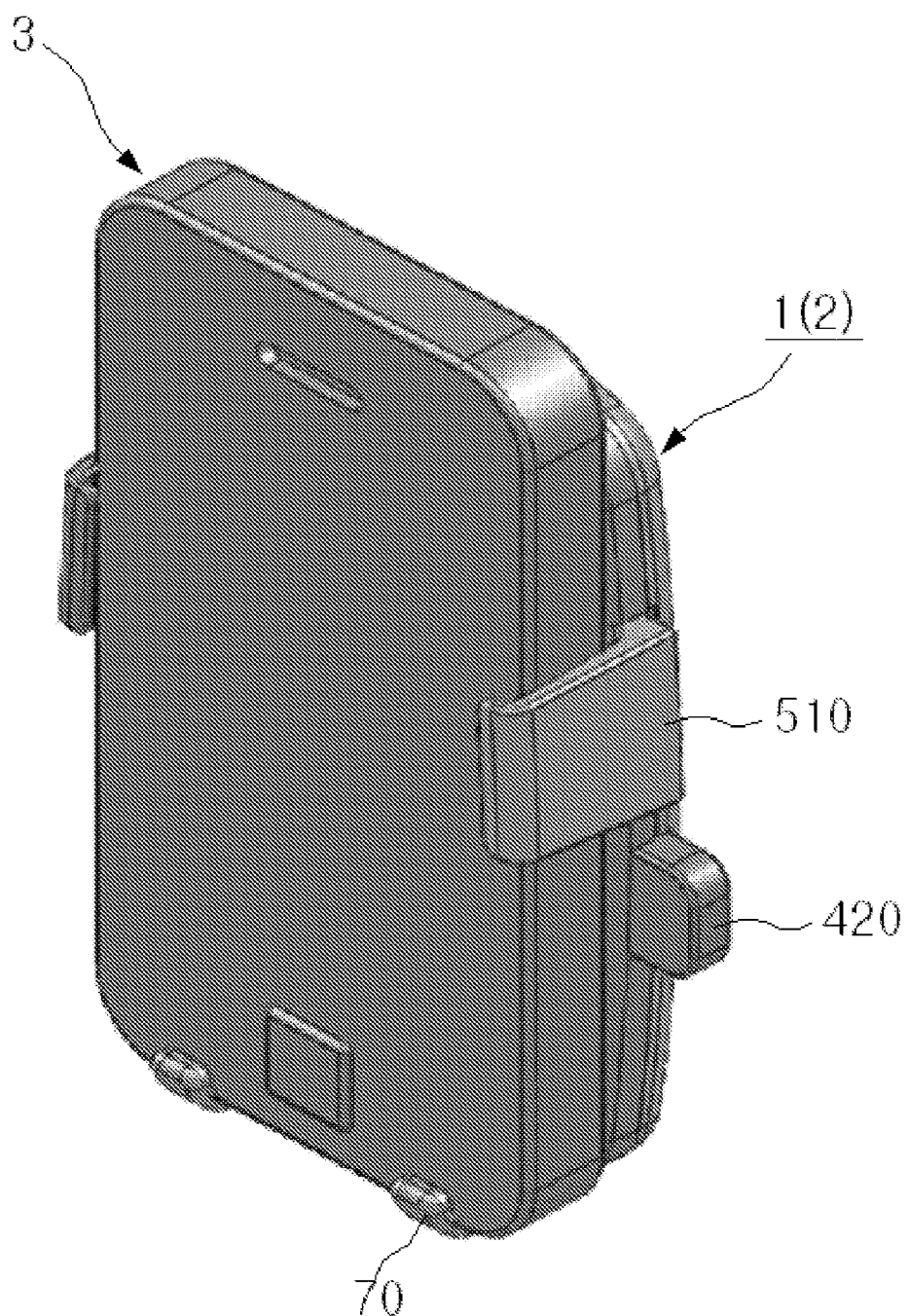

FIGS. 7 and 8 are diagrams for explaining a method for holding a mobile device using the holder according to the embodiment of the present invention.

First, in a state where a mobile device 3 is not held as illustrated in FIG. 7, the first switch 610 is protruded to the outside of the front surface portion 12, and the other sides of the first and second arm moving shafts 430 and 530 are closely attached to both sides of the pressurization plate 612 so as to compress the first and second elastic members 460 and 560. Accordingly, the first and second arms 410 and 510 are protruded to the outside of the main body, and the first and second buttons 420 and 520 are pushed to the inside of the main body.

When the portable device 3 is to be fixed to the holder 1 or 2, the portable device 3 is closely attached to the front surface portion 12 in the front surface side of the holder 1 or 2 as illustrated in FIG. 8. Then, the first switch 610 is pressurized, and the pressurization plate 612 compresses the third elastic member 620. Accordingly, the first and second elastic members 460 and 560 are restored to move the first and second arm moving shafts 430 and 530 to the inside of the main body, and the distance between the first and second arms 410 and 510 is decreased to fix the portable device 3 on the holder 1 or 2. Simultaneously, the first and second button moving shafts 440 and 540 are moved to protrude the first and second buttons 420 and 530 to the outside of the main body.

When the portable device 3 is to be detached from the holder 1 or 2, the first and second buttons 420 and 520 are pushed to the inside of the main body. Then, while the first and second elastic members 460 and 560 are compressed, the distance between the first and second arm moving shafts 430 and 530, that is, the distance between the first and second arms 410 and 510 is increased, and the first switch 610 is protruded by the restoring force of the third elastic member 620.

Meanwhile, before the portable device 3 is held as illustrated in FIGS. 7 and 8, the bracket 70 may be moved downward from the main body to sufficiently secure a space for holding the portable device 3. After the portable device 3 is fixed by the first and second arms 410 and 510, the bracket 70 may be moved upward, and the knob 92 may be tightened to further stably maintain the fixed state of the portable device 3. Furthermore, since a cable for connecting the portable device 3 to an external device may be passed through the opening 722 of the bracket 70, the portable device 3 and the external device may be stably connected to each other through the external connection cable without physical stress.

As such, potable devices having various widths may be held by the first and second arms 410 and 510, and stably fixed by the bracket 70. Furthermore, since the bracket 70 is formed to move left and right and/or up and down, various types of portable devices may be held regardless of the lengths of the portable devices.

Therefore, when a portable device was replaced, a holder for a new portable device is not needed separately. Accordingly, the holder according to the embodiment of the present invention has an advantage in cost and resource saving.

In another embodiment of the present invention, the rear cover 20 may further include a coupling unit 250 formed on the rear surface portion thereof. Through the coupling unit 250, the holder 1 or 2 according to the embodiment of the present invention may be coupled to an adhesion-type holder (not illustrated). Accordingly, when the adhesion-type holder is fixed to a dashboard or front window of a vehicle and a portable device is mounted on the holder 1 or 2, the portable device may be freely used while driving.

According to the embodiment of the present invention, a portable device may be stably mounted on the holder only by a simple operation of contacting the portable device with a holding surface. Furthermore, the portable device mounted on the holder may be released by a simple operation of pressing the buttons at both sides of the holder. Therefore, it is possible to stably mount or release the portable device, without performing a troublesome manipulation or applying a physical force.

Furthermore, since the operation for mounting the portable device on the holder and the operation for releasing the portable device from the holder are performed by the expansion and compression operations of the springs, the manufacturing cost of the holder may be reduced, which makes it possible to improve customer satisfaction.

While the present invention has been described with respect to the specific embodiments, it will be apparent to those skilled in the art that various changes and modifications may be made without departing from the spirit and scope of the invention as defined in the following claims.

What is claimed is:

1. A holder for a portable device, comprising:
   a main body having the portable device received on a front surface portion thereof;
   a first switch formed at a designated position of the front surface portion of the main body so as to be pushed into and protruded from the front surface portion;
   first and second arms formed at both side surfaces of the main body, and having a distance provided therebetween and varied by the first switch such that the portable device is attached or detached;
   a second switch comprising a first button formed to be physically connected to the first arm inside the main body and a second button formed to be physically connected to the second arm inside the main body, and for varying the distance between the first and second arms;

wherein the main body comprises:

a front cover having a switch through-hole through which the first switch is pushed and protruded, and a rear cover having a switch assembling hole formed at a position corresponding to the switch through-hole, and formed to be coupled to the front cover;

wherein the rear cover comprises:

a housing unit comprising an upper housing unit having the switch assembling hole formed in the center thereof and a lower housing unit formed adjacent to the bottom of the upper housing unit, and a hole formed at the bottom of the rear cover and coupled to a knob for fixing or moving a bracket; and a first attach/detach control unit comprises:

a first arm moving shaft having one side extended perpendicular from the first arm, housed in one side of the upper housing unit, and having a first switch coupling groove formed at an end of the other side thereof so as to be coupled to the first switch;

a first button moving shaft formed at a position spaced at a designated distance in a direction perpendicular to the extension direction of the first arm moving shaft, extended in the same direction as the extension direction of the first arm moving shaft, and housed in the other side of the lower housing unit, a first button formed at an end of one side of the first button moving shaft, which faces the side to which the first button moving shaft and the first moving shaft are connected, and a first elastic member formed to a designated length in a formation direction of the first arm moving shaft from an end of the other side of the first button moving shaft, and coupled to a first elastic member.

2. The holder according to claim 1, wherein the first switch comprises a push switch.

3. The holder according to claim 2, wherein the first and second arms are moved toward the inside of the main body by a push operation of the first switch.

4. The holder according to claim 1, wherein the first and second buttons respectively comprise a push switch.

5. The holder according to claim 4, wherein the first and second arms are moved toward the outside of the main body by manipulating the first and second buttons.

6. The holder according to claim 1, the bracket formed at the bottom of the main body so as to support the portable device.

7. The holder according to claim 6, wherein the bracket is fixed to a rear surface portion of the main body by the knob, and formed to move left and right depending on a fixed state of the knob.

8. The holder according to claim 7, wherein the bracket is formed to move up and down depending on the fixed state of the knob.

9. The holder according to claim 1, further comprising a second attach/detach control unit having an axisymmetric structure with the first attach/detach control unit.

10. The holder according to claim 9, wherein the second attach/detach control unit comprises:

a second arm moving shaft having the other side extended perpendicular from the second arm, housed in the other side of the upper housing unit, and having a second switch coupling groove formed at an end of one side thereof so as to be coupled to the first switch;

a second button moving shaft formed at a position spaced at a designated distance in a direction perpendicular to the extension direction of the second arm moving shaft, extended in the same direction as the extension direction of the second arm moving shaft, and housed in one side of the lower housing unit;

a second button formed at an end of the other side of the second button moving shaft, which faces the side to which the second button moving shaft and the second moving shaft are connected; and a second elastic member formed to a designated length in a formation direction of the second arm moving shaft from an end of one side of the second button moving shaft, and coupled to a second elastic member.

11. The holder according to claim 10, further comprising:

a third elastic member housed in the switch assembling hole; and the first switch having a pressurization plate formed on the third elastic member.

12. The holder according to claim 11, wherein, when the third elastic member is expanded to protrude the first switch, ends of the first and second arm moving shafts are closely attached to both sides of the pressurization plate, and the first and second elastic members are compressed.

13. The holder according to claim 12, wherein the first and second buttons are protruded to the outside of the main body.

14. The holder according to claim 11, wherein, when the third elastic member is compressed by the pressurization plate, the first switch is coupled to the first and second switch coupling grooves, and the first and second elastic members are expanded.

15. The holder according to claim 14, wherein the first and second buttons are pushed to the inside of the main body.

16. The holder according to claim 1, wherein the knob is coupled to a nut through the hole.

17. The holder according to claim 1, wherein the hole is formed in such a manner that the knob moves left and right.

18. The holder according to claim 1, wherein the bracket comprises:

an up and down moving unit having a movement hole through which the knob is passed, and formed to move up and down along the knob; and a support unit formed to protrude from the front surface portion of the main body.

19. The holder according to claim 18, wherein the support unit further comprises an opening formed in the center thereof.

20. The holder according to claim 1, further comprising a coupling unit provided on a rear surface portion of the main body.

* * * * *